(12) United States Patent  
Komuro

(10) Patent No.: US 6,326,278 B1
(45) Date of Patent: Dec. 4, 2001

(54) METHOD OF PROTECTING AN ALIGNMENT MARK WHEN MANUFACTURING A SEMICONDUCTOR DEVICE

(75) Inventor: Masahiro Komuro, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/239,679

(22) Filed: Jan. 29, 1999

(30) Foreign Application Priority Data

Feb. 13, 1998 (JP) .................................................. 10-031828

(51) Int. Cl.$^7$ ..................................................... H01L 21/76
(52) U.S. Cl. .................. 438/401; 438/462; 438/975; 438/976
(58) Field of Search ................................ 438/401, 462, 438/671, 975, 976

(56) References Cited

U.S. PATENT DOCUMENTS 5,369,050 * 11/1994 Kawai .................................... 438/401
5,401,691 * 3/1995 Caldwell ............................... 438/633
5,817,572 * 10/1998 Chiang et al. ........................ 438/624
6,020,241 * 2/2000 You et al. ............................. 438/278

FOREIGN PATENT DOCUMENTS

| 1-149435 | 6/1989 | (JP) . |
| 2-211652 | 8/1990 | (JP) . |
| 4-357856 | 12/1992 | (JP) . |
| 5-36600 | 2/1993 | (JP) . |
| 6-140600 | 5/1994 | (JP) . |
| 7-130741 | 5/1995 | (JP) . |

* cited by examiner

*Primary Examiner*—Olik Chaudhuri
*Assistant Examiner*—Kurt Eaton
(74) *Attorney, Agent, or Firm*—Young & Thompson

(57) ABSTRACT

First, a conductive layer is formed on a semiconductor substrate having an alignment mark formed thereon. Next, a photoresist is selectively formed on a region of the conductive layer in which a wiring layer is to be formed and on the alignment mark. Subsequently, the conductive layer is etched by using the photoresist as a mask.

7 Claims, 10 Drawing Sheets

METHOD OF PROTECTING AN ALIGNMENT MARK WHEN MANUFACTURING A SEMICONDUCTOR DEVICE

BACKGROUND OF THE INVENTION

1. Field of the Invention

The present invention relates to a method for manufacturing a semiconductor device which uses an alignment mark in order to cause an overlapping of a lower layer pattern and an upper layer pattern and, more particularly, to a method for manufacturing a semiconductor device which can prevent an alignment mark from being changed in shape.

2. Description of the Related Art

In a lithography step of a manufacturing process for a semiconductor device, in order to cause an overlapping with a high precision of a lower layer pattern and an upper layer pattern, there has hitherto been executed a method wherein an alignment mark is formed on the lower layer pattern and, using this alignment mark as a basis, a mask for use on the upper layer pattern is positionally aligned. FIGS. 1A to 1G are sectional views illustrating in the sequential step order a conventional method for manufacturing a semiconductor device.

In the conventional method for manufacturing a semiconductor device, first, as shown in FIG. 1A, an element isolating oxide film 101a and gate patterns 102 are formed on a semiconductor substrate 101 and a convex type alignment mark 103 is also formed thereon.

Next, as shown in FIG. 1B, an oxide film 104' having a thickness of, for example, 800 nm or so is deposited on an entire surface of the resulting semiconductor substrate by, for example, a chemical vapor deposition (CVD) technique. Then, by reflow, etchback, chemical-mechanical polishing (CMP) or the like, the oxide film 104' is flattened. As a result, a flat oxide film 104 is formed.

Thereafter, as shown in FIG. 1C, a photoresist 105 is coated on an entire surface of the substrate. Then, an exposure light 106 is radiated onto the photoresist 105 by a reduced projection type exposure apparatus through a contact-forming mask 107 disposed above the semiconductor substrate 101 and having a prescribed configuration. As a result of this, a contact opening portion 108 and an alignment mark opening portion 109 are simultaneously exposed. Then, the photoresist 105 is developed.

Subsequently, as shown in FIG. 1D, by the use of a dry etching technique, the portions of the oxide film 104 corresponding to the contact opening portion 108 and to the alignment mark opening portion 109 are removed to thereby open a contact hole 110 and simultaneously expose the alignment mark 103.

Next, as shown in FIG. 1E, a polycrystalline silicon film 111 having a thickness of, for example, 800 nm or so is deposited and thereafter the polycrystalline silicon film 111 is etched back by isotropic etching. As a result of this, the polycrystalline silicon film 111 is buried into the contact hole 110.

Then, as shown in FIG. 1F, a conductive layer 112 that consists of a WSi film having a thickness of, for example, 100 nm is deposited on an entire surface of the resulting substrate. And, a photoresist is coated on an entire surface of the resulting substrate. Then, an exposure light 114 is radiated onto the photoresist by the reduced projection type exposure apparatus through a wire-forming mask 115 disposed above the semiconductor substrate 101. At this time, the wire-forming mask 115 has a light-shielding portion at only a region aligned with the contact hole 110. And, by developing the photoresist, the photoresist 113 is caused to remain on a wiring layer forming predetermined region, e.g., the contact hole 110.

Subsequently, using the photoresist 113 as a mask, the conductive layer 112 is etched by anisotropic dry etching. As a result of this, as shown in FIG. 1G, a wiring layer 112' connected to the contact hole 110 is formed. Simultaneously, the convex type alignment mark 103 is exposed.

Thereafter, although not shown, using the thus-exposed convex type alignment mark 103 as a basis, a mask is positionally aligned to thereby form an upper layer pattern.

However, in this conventional method for manufacturing a semiconductor device, when etching the conductive layer 112, as shown in FIG. 1G, the convex type alignment mark 103 is inconveniently deformed. When the convex type alignment mark 103 is deformed, the precision with which the mask is positionally aligned becomes inconveniently decreased at the time of overlapping the upper layer pattern.

Also, in order to make it easy to detect an alignment mark, there has hitherto been proposed a method for enlarging a difference in level between the alignment mark and the semiconductor substrate (Japanese Patent Application Laid-Open No. Hei 1-149435). FIGS. 2A to 2D are sectional views illustrating in the sequential step order a conventional method for manufacturing a semiconductor device that is described in Japanese Patent Application Laid-Open No. Hei 1-149435.

In the conventional manufacturing method disclosed in this Publication, first, as shown in FIG. 2A, a glue insulating film 42 is formed on a semiconductor substrate 41 and, on the insulating film 42, a glue metal wiring layer 43 is formed as an alignment mark.

Next, as shown in FIG. 2B, an oxide film 44 is formed in such a way as to cover the glue metal wiring layer 43 and flattened. Thereafter, a photoresist 45 is coated onto an entire surface of the resulting substrate. And, simultaneously with the exposing of the contact hole, the glue metal wiring layer 43 and a portion surrounding it is exposed. Thereafter, the photoresist 45 is developed. As a result of this, the photoresist 45 aligned with the glue metal wiring 43 and its surrounding portion is removed.

Subsequently, as shown in FIG. 2C, the portion corresponding to the contact hole is etched and simultaneously the portions of the glue metal wiring layer 43 and its surrounding portion are etched to thereby expose an upper part of the glue metal wiring layer 43 from the oxide film 44.

Thereafter, as shown in FIG. 2D, an upper metal wiring layer 46 is formed and a photoresist 47 is formed thereon. And, alignment is done by the use of a laser light or the like.

Further, in order to prevent an alignment mark from being damaged, there has hitherto been proposed a method for forming a concave type alignment mark (Japanese Patent Application Laid-Open No. Hei 5-36600). FIGS. 3A to 3G are sectional views illustrating a conventional method for manufacturing a semiconductor device in the sequential step order that is described in Japanese Patent Application Laid-Open No. Hei 5-36600.

In the conventional manufacturing method disclosed in this Publication, first, as shown in FIG. 3A, concave type alignment marks 52 are formed at the surface of a semiconductor substrate 51 and then an etchback photoresist 53 is formed on an entire surface of the resulting substrate. The surface of this etchback photoresist 53 is flat and smooth.

Also, the semiconductor substrate 51 and etchback photoresist 53 have approximately the same etching rate.

Next, as shown in FIG. 3B, a photosensitive resist 54 is coated on the etchback photoresist 53. It is to be noted that on the etchback photoresist 53 there may be formed an electron beam resist.

Subsequently, as shown in FIG. 3C, a mask is provided at a prescribed region located above the alignment mark 52, whereby as indicated by the arrow marks the photosensitive resist 54 is exposed with the use of an exposure light. In a case where an electron beam resist has been used instead of the photosensitive resist 54, electron beams are radiated.

And, by developing the photosensitive resist 54, as shown in FIG. 3D, the photosensitive resist 54 is caused to remain at a prescribed region located above the alignment marks 52. At this time, the etchback photoresist 53 is non-photosensitive and therefore is not removed and remains. Further, in order to cause the photosensitive resist 54 that has remained to have the same etching rate as that of the semiconductor substrate 51, the photosensitive resist 54 and the etchback photoresist 53 are both baked.

Thereafter, as shown in FIG. 3E, the entire surface of the resulting substrate is etched back as indicated by the arrows by dry etching such as reactive sputter etching.

At the early stage of this etchback step, at a prescribed region above the alignment marks 52 the photosensitive resist 54 is etched and at the other region the etchback photoresist 53 is etched. For this reason, after the photosensitive resist 54 has been etched, the etchback photoresist 53 is etched at the prescribed region. Accordingly, when the semiconductor substrate 51 has been flattened in said other region, as shown in FIG. 3F, the etchback photoresist 53 still remains to exist in said prescribed region. Namely, the alignment mark 52 is protected from being etched.

Next, as shown in FIG. 3G, by removing the etchback photoresist 53 remaining to exist, the concave type alignment marks 52 that have theretofore been protected are exposed. As a result of this, the flattening of the semiconductor substrate 51 is ended.

Also, in order to prevent the getting out of focus at the time of exposure, there has hitherto been proposed a method for manufacturing a semiconductor device that reduces the difference in height between a scribe line region and an element region (Japanese Patent Application Laid-Open No. Hei 2-211652). In the conventional manufacturing method described in this Publication, an insulating film and wiring film are caused to remain in the scribe line region, thereby preventing the misfocusing and the extending of cracks.

However, in the conventional method described in Japanese Patent Application Laid-Open No. Hei 1-149435, since in order to form a large difference in level even the glue metal wiring layer 43 itself is etched, the configuration of the convex type alignment mark is inconveniently deformed. For this reason, the alignment mark that is used for overlapping in the next lithography step becomes out of shape, raising the problem that the precision of overlapping decreases.

On the other hand, in the conventional method described in Japanese Patent Application Laid-Open No. Hei 5-36600, in order to protect only the alignment mark alone, the non-photosensitive resist and photosensitive resist are needed to be coated so as to protect the alignment mark and thereafter the photosensitive resist is further needed to be coated to thereby form a pattern. As a result, the coating of the resist is needed three times or more, raising the problem that the number of the manufacturing process steps increases and this causes a rise in the cost.

Further, in the conventional method described in Japanese Patent Application Laid-Open No. Hei 2-211652, it is difficult to stabilize the configuration of the alignment mark.

SUMMARY OF THE INVENTION

An object of the present invention is to provide a method for manufacturing a semiconductor device, which makes it possible to form a pattern by inexpensive and highly precise overlapping.

A method for manufacturing a semiconductor device according to the present invention is characterized by comprising the steps of: forming a conductive layer on a semiconductor substrate having an alignment mark formed thereon; forming a photoresist selectively on a region of the conductive layer in which wiring layer is to be formed and on the alignment mark; and etching the conductive layer by using the photoresist as a mask.

The step of forming the photoresist may comprise the steps of: coating a photoresist on an entire surface of the conductive layer; exposing to light the photoresist by using a mask which shields the region in which the wiring layer is to be formed and the alignment mark; and developing the photoresist.

Also, the step of etching the conductive layer may be followed by the steps of: aligning positionally a mask for use in the formation of an upper layer by using the alignment mark as a basis; and forming the upper layer pattern on the semiconductor substrate by using the mask.

Further, the step of forming the conductive layer may be preceded by the steps of: forming an interlayer insulating film on the semiconductor substrate; flattening the interlayer insulating film; opening a region of the interlayer insulating film in which a contact hole is to be formed and a region thereof located on the alignment mark; and burying a polycrystalline silicon film into the contact hole.

Furthermore, the alignment mark may be located on a scribe line of the semiconductor substrate and the conductive layer may consist of a silicide film.

In the present invention, the photoresist formed in order to etch the conductive layer formed on the semiconductor substrate is caused to remain also above the alignment mark and therefore it is possible to reliably prevent the deformation of the alignment mark at the time of etching the conductive layer. Also, the detection of the alignment mark is easy. This enables the formation of an upper layer pattern in the next step with a high precision. Also, by covering the scribe line region including the alignment mark by the use of a photoresist, the deformation of the alignment mark can be prevented even when getting out of position occurs at the time of wiring silicide lithography. Further, because the alignment mark is exposed simultaneously with the formation of a wiring layer, no necessity exists of providing a special step for exposing the alignment mark and this makes it possible to prevent a rise in the cost.

DETAILED DESCRIPTION OF THE PREFERRED EMBODIMENTS

A concrete explanation will hereafter be given of a method for manufacturing a semiconductor device according to an embodiment of the present invention with reference to the accompanying drawings. FIGS. 4A to 4G are sectional views illustrating in the sequential step order a method for manufacturing a semiconductor device according to a first embodiment of the present invention.

Figure 1A:
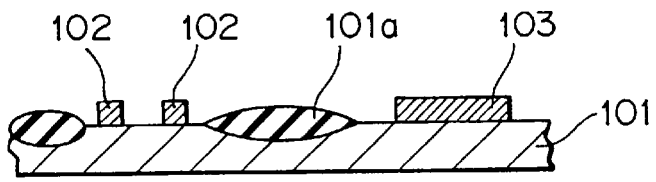
FIGS. 1A to 1G are sectional views illustrating in the sequential step order a conventional method for manufacturing a semiconductor device.
Figure 1B:
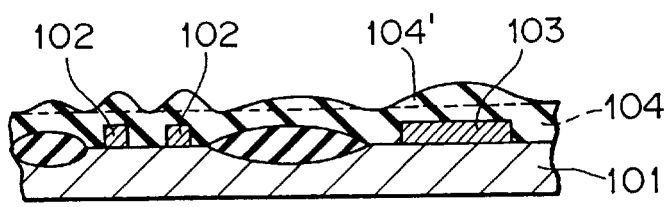
Figure 1C:
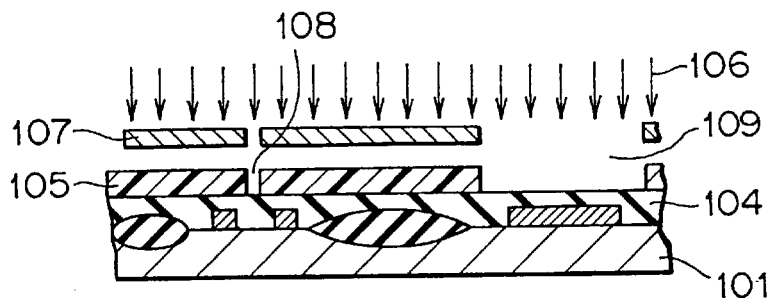
Figure 1D:
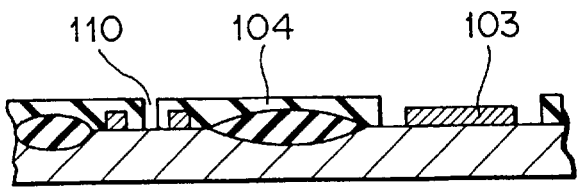
Figure 1E:
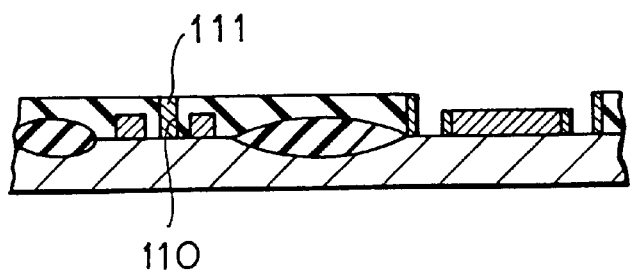
Figure 1F:
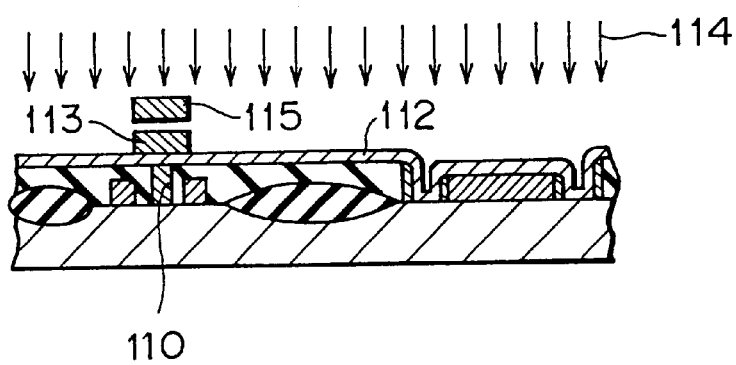
Figure 1G:
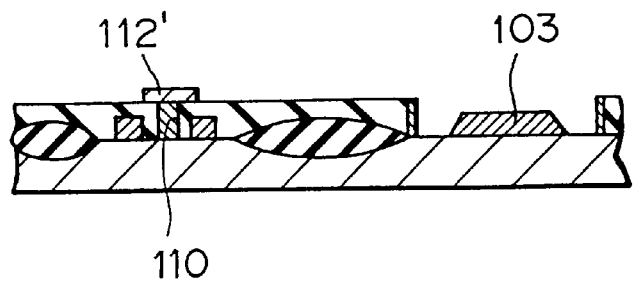
Figure 2A:
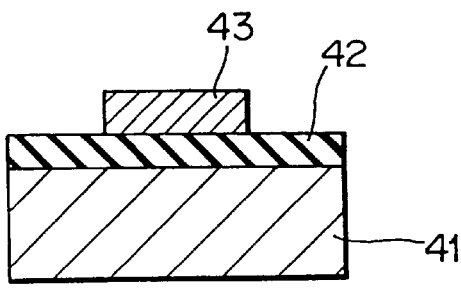
FIGS. 2A to 2D are sectional views illustrating a conventional method for manufacturing a semiconductor device in the sequential step order, which is described in Japanese Patent Application Laid-Open No. Hei 1-149435.
Figure 2B:
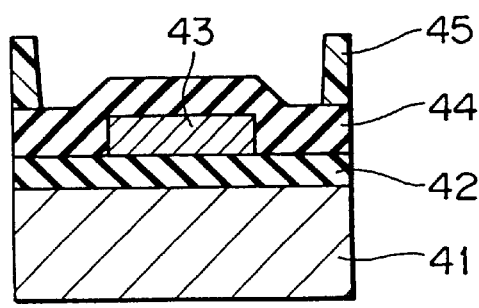
Figure 2C:
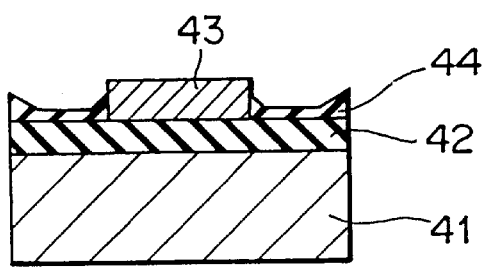
Figure 2D:
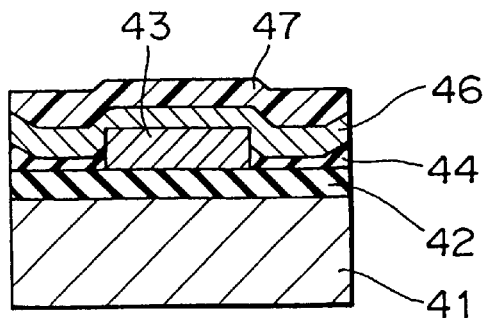
Figure 3A:
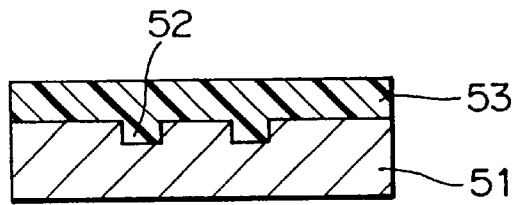
FIGS. 3A to 3G are sectional views illustrating a conventional method for manufacturing a semiconductor device in the sequential step order, which is described in Japanese Patent Application Laid-Open No. Hei 5-36600.
Figure 3B:
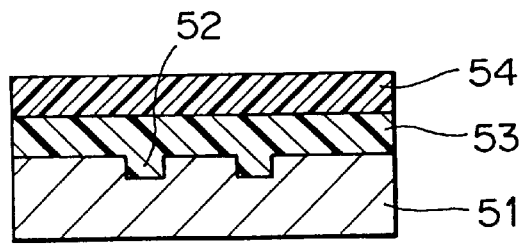
Figure 3C:
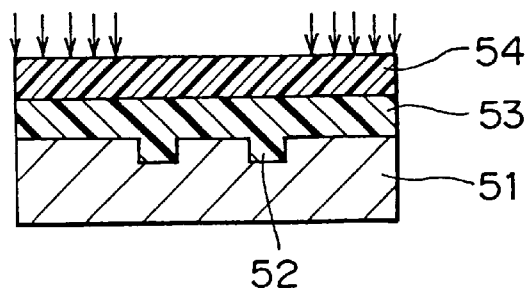
Figure 3D:
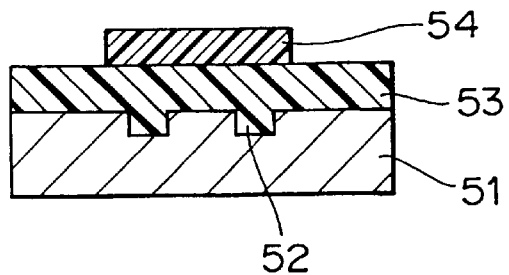
Figure 3E:
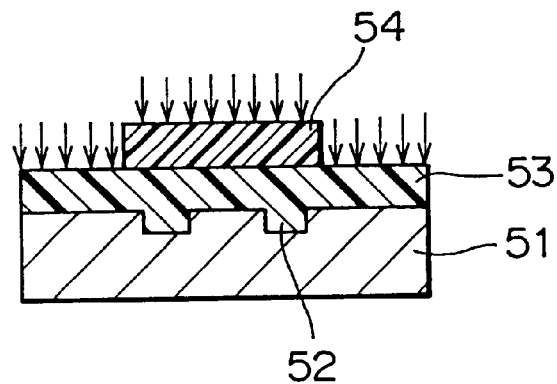
Figure 3F:
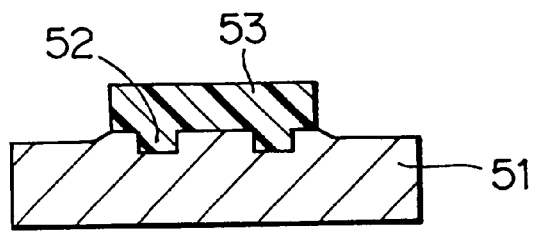
Figure 3G:
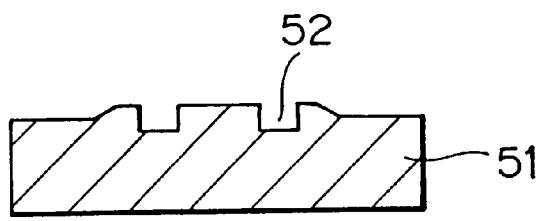
Figure 4A:
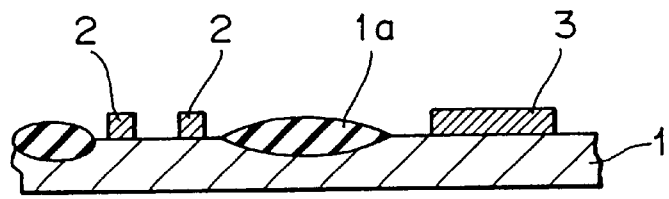
FIGS. 4A to 4G are sectional views illustrating a method for manufacturing a semiconductor device in the sequential step order according to a first embodiment of the present invention.

In the first embodiment, first, as shown in FIG. 4A, an element isolating oxide film 1a and gate patterns 2 are formed on a semiconductor substrate 1 and a convex type alignment mark 3 is also formed thereon.

Figure 4B:
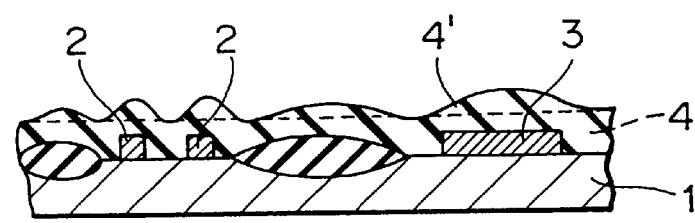

Next, as shown in FIG. 4B, an oxide film 4' having a thickness of, for example, 800 nm or so is deposited on an entire surface of the resulting semiconductor substrate by, for example, a chemical vapor deposition (CVD) technique. Then, by reflow, etchback, chemical-mechanical polishing (CMP) or the like, the oxide film 4' is flattened. As a result, a flat oxide film 4 is formed.

Figure 4C:
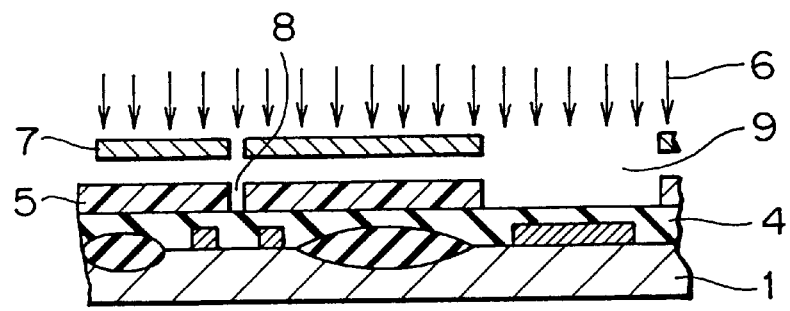

Thereafter, as shown in FIG. 4C, a photoresist 5 is coated on an entire surface of the substrate. Then, an exposure light 6 is radiated onto the photoresist 5 by a reduced projection type exposure apparatus through a contact-forming mask 7 disposed above the semiconductor substrate 1 and having a prescribed configuration. As a result of this, a contact opening portion 8 and an alignment mark-opening portion 9 are simultaneously exposed. Then, the photoresist 5 is developed.

Figure 4D:
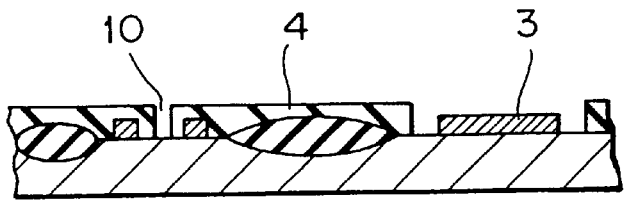

Subsequently, as shown in FIG. 4D, by the use of a dry etching technique, the portions of the oxide film 4 corresponding to the contact opening portion 8 and to the alignment mark opening portion 9 are removed to thereby open a contact hole 10 and simultaneously expose the alignment mark 3.

Figure 4E:
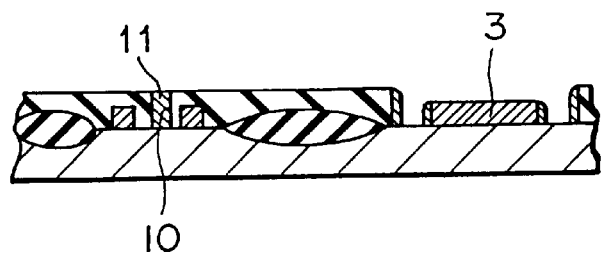

Next, as shown in FIG. 4E, a polycrystalline silicon film 11 having a thickness of, for example, 800 nm or so is deposited and thereafter the polycrystalline silicon film 11 is etched back by isotropic etching. As a result of this, the polycrystalline silicon film 11 is buried into the contact hole 10.

Figure 4F:
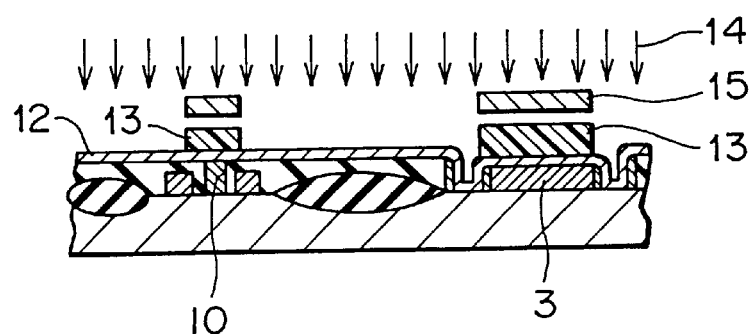

Then, as shown in FIG. 4F, a conductive layer 12 that consists of a WSi film having a thickness of, for example, 100 nm is deposited on an entire surface of the resulting substrate. And, a photoresist is coated on an entire surface the resulting substrate. Then, an exposure light 14 is radiated onto the photoresist by the reduced projection type exposure apparatus through a wire-forming mask 15 disposed above the semiconductor substrate 1. At this time, the wire-forming mask 15 has a light-shielding portion only at a region aligned with a contact hole 10 and its surrounding portion as well as at a region aligned with the convex type alignment mark 3. And, by developing the photoresist, the photoresist 13 is selectively caused to remain on a wiring layer forming predetermined region, e.g., the contact hole 10 and its surrounding portion as well as on a region located above the convex type alignment mark 3.

Figure 4G:
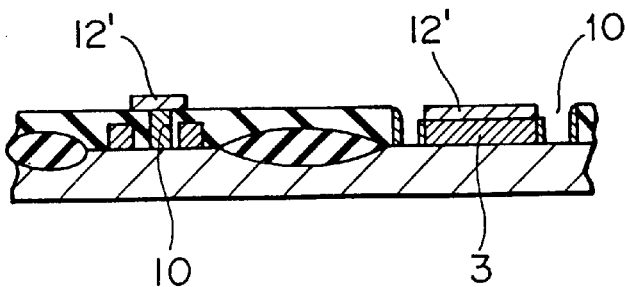

Subsequently, using the photoresist 13 as a mask, the conductive layer 12 is etched by anisotropic dry etching. As a result of this, as shown in FIG. 4G, a wiring layer 12' connected to the contact hole 10 is formed. At this time, since the photoresist 13 is formed also on the convex type alignment mark 3, the wiring layer 12' is formed also on the convex type alignment mark 3.

Thereafter, although not shown, using the thus-exposed convex type alignment mark 3 as a basis, a mask is positionally aligned to thereby form an upper layer pattern.

In this way, in this embodiment, since the wiring layer 12' is formed also on the convex type alignment mark 3, the convex type alignment mark 3 is protected and no deformation occurs in the shape thereof. As a result of this, it is possible to perform excellent alignment when forming an upper layer pattern. Also, since the times at which the resist is coated are also decreased, it is possible to prevent a rise in the cost.

Next, a second embodiment of the present invention will be explained. FIGS. 5A to 5G are sectional views illustrating a method for manufacturing a semiconductor device in the sequential step order according to a second embodiment of the present invention.

Figure 5A:
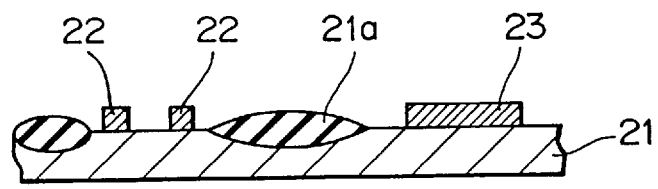
FIGS. 5A to 5G are sectional views illustrating a method for manufacturing a semiconductor device in the sequential step order according to a second embodiment of the present invention.

In the second embodiment, first, as shown in FIG. 5A, an element isolating oxide film 21a and gate patterns 22 are formed on a semiconductor substrate 21 and a convex type alignment mark 23 is also formed thereon.

Figure 5B:
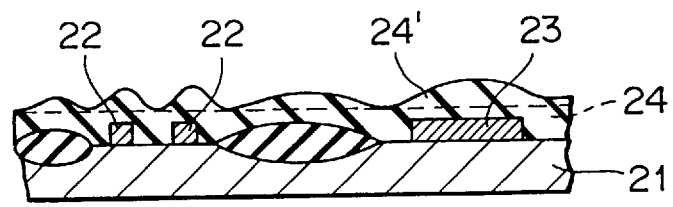

Next, as shown in FIG. 5B, an oxide film 24' having a thickness of, for example, 800 nm or so is deposited on an entire surface of the resulting semiconductor substrate by, for example, a chemical vapor deposition (CVD) technique. Then, by reflow, etchback, chemical-mechanical polishing (CMP) or the like, the oxide film 24' is flattened. As a result, a flat oxide film 24 is formed.

Figure 5C:
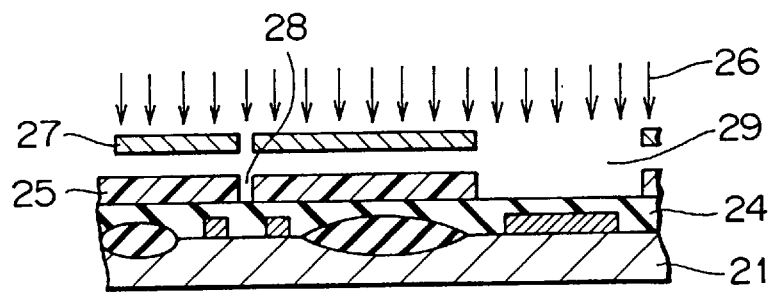

Thereafter, as shown in FIG. 5C, a photoresist 25 is coated on an entire surface of the substrate. Then, an exposure light 26 is radiated onto the photoresist 25 by a reduced projection type exposure apparatus through a contact-forming mask 27 disposed above the semiconductor substrate 21 and having a prescribed configuration. As a result of this, a contact opening portion 28 and an alignment mark opening portion 29 are simultaneously exposed. Then, the photoresist 25 is developed.

Figure 5D:
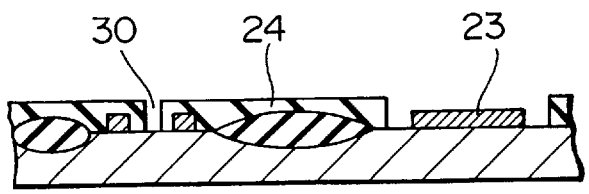

Subsequently, as shown in FIG. 5D, by the use of a dry etching technique, the portions of the oxide film 24 corresponding to the contact opening portion 28 and to the alignment mark opening portion 29 are removed to thereby open a contact hole 30 and simultaneously expose the alignment mark 23.

Figure 5E:
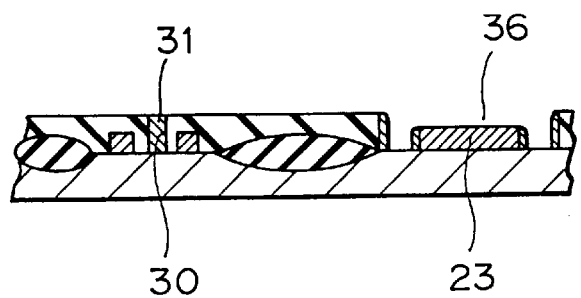

Next, as shown in FIG. 5E, a polycrystalline silicon film 31 having a thickness of, for example, 800 nm or so is deposited and thereafter the polycrystalline silicon film 31 is etched back by isotropic etching. As a result of this, the polycrystalline silicon film 31 is buried into the contact hole 30.

Figure 5F:
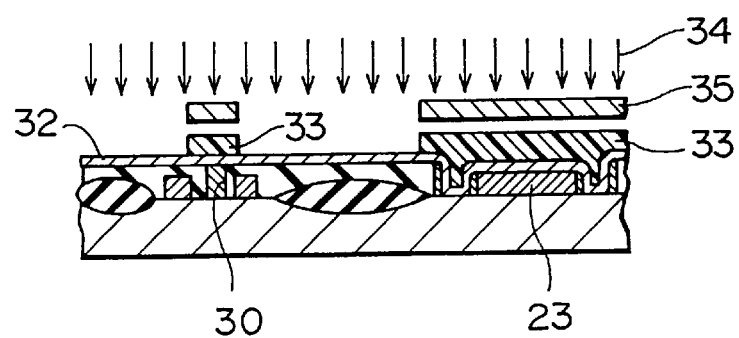

Then, as shown in FIG. 5F, a conductive layer 32 that consists of a WSi film having a thickness of, for example, 100 nm is deposited on an entire surface of the resulting substrate. And, a photoresist is coated on an entire surface the resulting substrate. Then, an exposure light 34 is radiated onto the photoresist by the reduced projection type exposure apparatus through a wire-forming mask 35 disposed above the semiconductor substrate 31. At this time, the wire-forming mask 35 has a light-shielding portion only at a region aligned with a scribe line portion 36 including the convex type alignment mark 23 as well as at a region aligned with the contact hole 30 and its surrounding portion. And, by developing the photoresist, the photoresist 33 is selectively caused to remain on a wiring layer forming predetermined region, e.g., the contact hole 30 and its surrounding portion as well as the scribe line portion 36 including the convex type alignment mark 23.

Figure 5G:
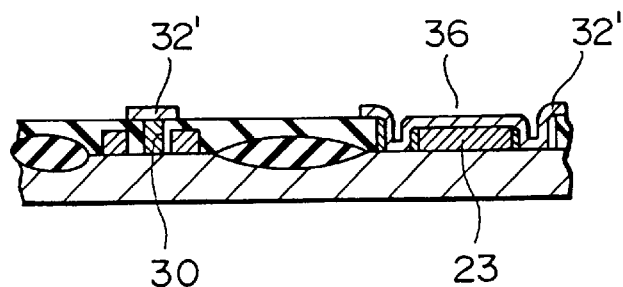
Figure 6:
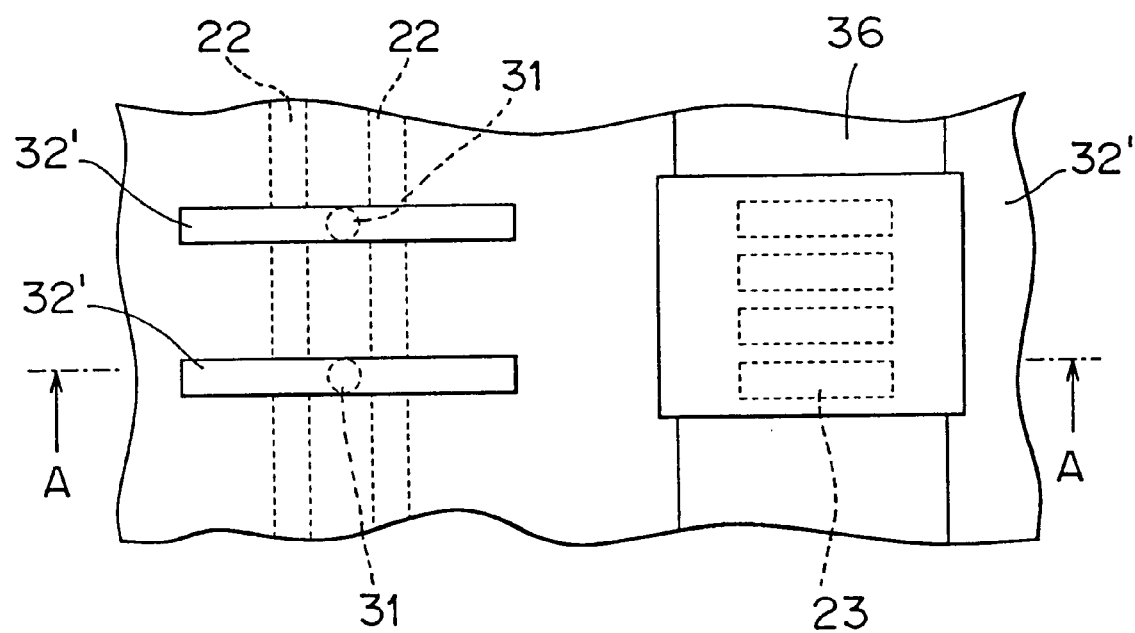
FIG. 6 is a plan view illustrating a semiconductor device that has been manufactured by the method according to the second embodiment.

FIG. 6 is a plan view illustrating a semiconductor device that has been manufactured by the method according to the second embodiment and a sectional view taken along a line A—A of FIG. 6 corresponds to the view of FIG. 5G. After having developed the photoresist, using the remaining photoresist 33 as a mask, the conductive layer 32 is etched by anisotropic dry etching. As a result of this, as shown in FIGS. 5G and 6, a wiring layer 32' connected to the contact hole 30 is formed. At this time, since the photoresist 33 was formed also on the scribe line portion 36 including the convex type alignment mark 23, the wiring layer 32' is formed also on the scribe line portion 36 including the convex type alignment mark 23.

Thereafter, although not shown, using the thus-exposed convex type alignment mark 23 as a basis, a mask is positionally aligned to thereby form an upper layer pattern.

In this way, in this embodiment, since the wiring layer 32' is formed also on the scribe line portion 36 including the convex type alignment mark 23, the convex type alignment mark 23 is protected even when getting out of position occurs at the time of lithography, with the result that no deformation occurs in the shape thereof. As a result of this, it is possible to perform excellent alignment when forming an upper layer pattern. Also, since the times at which the resist is coated are also decreased, it is possible to prevent a rise in the cost.

What is claimed is:

1. A method of manufacturing a semiconductor device, comprising the steps of:

defining a wiring region where a contact hole is to be formed on a semiconductor substrate;

forming an alignment mark from a first conductive layer in an alignment region on the semiconductor substrate;

forming an interlayer insulating film on the wiring region and the alignment region;

removing portions of the interlayer insulating film to open the contact hole in the interlayer insulating film and to expose the alignment mark;

filling the contact hole with an electrical conductor;

forming a second conductive layer on the interlayer insulating film, on the filled-in contact hole, and on the alignment mark;

covering the second conductive layer on a top surface of the alignment mark with a protective covering; and patterning the second conductive layer using the protective coating as a mask, including removing the second conductive layer from sidewalls of the alignment mark.

2. The method for manufacturing a semiconductor device according to claim 1, wherein the protective covering is a photoresist and further comprising the step of forming the photoresist over portions of said second conductive layer on said filled-in contact hole and on said alignment mark after the step of forming said second conductive layer.

3. The method for manufacturing a semiconductor device according to claim 2, wherein the step of forming said photoresist comprises the steps of:

coating a photoresist on an entire surface of said second conductive layer;

exposing to light said photoresist by using a mask which shields said wiring region and said alignment region; and developing said photoresist.

4. The method for manufacturing a semiconductor device according to claim 1, wherein the step of patterning said second conductive layer is followed by the steps of:

aligning positionally a mask for use in the formation of an upper layer by using said alignment mark as a basis; and forming an upper layer pattern on said semiconductor substrate by using said mask.

5. The method for manufacturing a semiconductor device according to claim 1, wherein said first conductive layer is a polycrystalline silicon film.

6. The method for manufacturing a semiconductor device according to claim 1, wherein said alignment mark is located on a scribe line of said semiconductor substrate.

7. The method for manufacturing a semiconductor device according to claim 1, wherein said second conductive layer consists of a silicide film.

* * * * *